US010442115B2

(12) United States Patent
Zhang et al.

(10) Patent No.: US 10,442,115 B2
(45) Date of Patent: Oct. 15, 2019

(54) MANUFACTURING THERMOPLASTIC COMPOSITES AND ARTICLES

(71) Applicant: JOHNS MANVILLE, Denver, CO (US)

(72) Inventors: Mingfu Zhang, Englewood, CO (US); Asheber Yohannes, Littleton, CO (US); Michael Block, Centennial, CO (US); Klaus Friedrich Gleich, Nuremberg (DE); Daniel P De Kock, Assenede (BE); Jawed Asrar, Englewood, CO (US)

(73) Assignee: Johns Manville, Denver, CO (US)

( * ) Notice: Subject to any disclaimer, the term of this patent is extended or adjusted under 35 U.S.C. 154(b) by 552 days.

(21) Appl. No.: 15/164,434

(22) Filed: May 25, 2016

(65) Prior Publication Data
US 2017/0341270 A1    Nov. 30, 2017

(51) Int. Cl.
| | | |
|---|---|---|
| B29B 11/16 | (2006.01) | |
| B29B 9/06 | (2006.01) | |
| B29C 43/00 | (2006.01) | |
| B29C 45/00 | (2006.01) | |
| B29B 15/12 | (2006.01) | |
| C08J 5/06 | (2006.01) | |
| C08J 5/08 | (2006.01) | |
| B29K 79/00 | (2006.01) | |

(Continued)

(52) U.S. Cl.
CPC .............. *B29B 11/16* (2013.01); *B29B 9/06* (2013.01); *B29B 15/122* (2013.01); *B29C 43/003* (2013.01); *B29C 45/0001* (2013.01); *C08J 5/06* (2013.01); *C08J 5/08* (2013.01); *B29C 48/022* (2019.02); *B29C 2045/0091* (2013.01); *B29K 2079/085* (2013.01); *B29K 2105/08* (2013.01); *C08J 2377/02* (2013.01)

(58) Field of Classification Search
CPC ......... B29B 11/16; B29B 9/06; B29B 15/122; B29C 43/003; B29C 45/0001; C08J 5/06; C08J 5/08
See application file for complete search history.

(56) References Cited

U.S. PATENT DOCUMENTS 5,165,941 A * 11/1992 Hawley ................ B29C 48/38
                                                             425/148
5,451,355 A    9/1995 Boissonnat et al.
(Continued)

FOREIGN PATENT DOCUMENTS

| CA | 2869490 A1 * | 5/2015 | ................ C08J 5/06 |
|---|---|---|---|
| CN | 102470559 A | 5/2012 | |

(Continued)

*Primary Examiner* — Anthony Calandra
*Assistant Examiner* — Jamel M Nelson
(74) *Attorney, Agent, or Firm* — Robert D. Touslee

(57) ABSTRACT

Embodiments of the present technology may include a method of making a thermoplastic composite strand. The method may include melting a reactive thermoplastic resin to form a molten reactive resin. The method may also include fully impregnating a plurality of continuous fibers with the molten reactive resin in an impregnation device. The method may further include polymerizing the molten reactive resin to form a thermoplastic resin matrix. In addition, the method may include cooling the thermoplastic resin matrix to form a thermoplastic composite strand.

26 Claims, 4 Drawing Sheets

(51) Int. Cl.
     *B29K 105/08*     (2006.01)
     *B29C 48/00*      (2019.01)

(56)          References Cited

U.S. PATENT DOCUMENTS

| | | | |
|---|---|---|---|
| 2008/0300350 A1* | 12/2008 | Ohno | C08F 283/06 |
| | | | 524/147 |
| 2010/0203331 A1* | 8/2010 | van der Woude | C03C 25/26 |
| | | | 428/391 |
| 2010/0286343 A1 | 11/2010 | Burghardt et al. | |
| 2014/0296377 A1 | 10/2014 | Tadepalli et al. | |
| 2015/0148485 A1 | 5/2015 | Yohannes et al. | |
| 2015/0148498 A1 | 5/2015 | Block et al. | |
| 2015/0165651 A1 | 6/2015 | Yao et al. | |
| 2016/0024266 A1 | 1/2016 | Zhang et al. | |
| 2016/0200870 A1* | 7/2016 | Zhu | B01J 19/0026 |
| | | | 528/339 |

FOREIGN PATENT DOCUMENTS

| | | | |
|---|---|---|---|
| CN | 104910374 A | 9/2015 | |
| EP | 0 505 139 A1 | 9/1992 | |
| EP | 1 982 814 A1 | 10/2008 | |
| EP | 2 228 351 A1 | 9/2010 | |
| EP | 2 774 944 A1 | 9/2014 | |
| EP | 2 876 135 A2 | 5/2015 | |
| JP | 05178985 A | 7/1993 | |
| JP | 2000008266 A | 1/2000 | |
| JP | 2015098535 A | 5/2015 | |

* cited by examiner

MANUFACTURING THERMOPLASTIC COMPOSITES AND ARTICLES

BACKGROUND

Thermoset plastics are favored for making many kinds of fiber-reinforced articles because of their ease of manufacture. Uncured thermosets are often low viscosity liquids at room temperature and easily wet a fabric of fibers. Once they have migrated through the fabric and surrounded its fibers, a curing stage (sometimes called a hardening stage) commences to polymerize the thermoset into a polymer matrix. Often, this wetting and curing takes place in a mold that defines the shape of the fiber-reinforced article.

The uncured thermoset resins used to make the composite are generally inexpensive, but often off-gas irritating and sometimes dangerous volatile organic compounds (VOCs). The outgassing of VOCs are of particular concern during curing, when the exothermic nature of many thermoset curing reactions raise the temperature of the composite and drive more VOCs into the gas phase. In many instances, it is necessary to cure large thermoset articles in facilities equipped with robust ventilation and air scrubbing equipment, increasing the overall production costs.

Thermoset articles are also difficult to repair or recycle. Hardened thermoset resins often have a high degree of crosslinking, making them prone to fractures and breaks. Because thermosets normally will not melt under heat, they have to be replaced instead of repaired by welding. Compounding difficulties, the unrepairable thermoset part normally cannot be recycled into new articles, but must instead be landfilled at significant cost and adverse impact on the environment. The problems are particularly acute when large thermoset parts, such as automotive panels and wind turbine blades, need to be replaced.

Because of these and other difficulties, thermoplastic resin systems are being developed for fiber-reinforced articles that were once exclusively made using thermosets. Thermoplastics typically have higher fracture toughness and chemical resistance than thermosets. They also melt at raised temperatures, allowing operators to heal cracks and weld together pieces instead of having to replace a damaged part. Perhaps most significantly, discarded thermoplastic parts can be broken down and recycled into new articles, reducing landfill costs and stress on the environment.

Unfortunately, thermoplastic composites have their own challenges. High melt viscosities of thermoplastic polymer resins may cause difficulties in impregnating reinforcing fibers. Conventional techniques for producing thermoplastic composites, such as extrusion compounding, break fibers down to very short lengths, which limits mechanical properties of composite articles. Existing processes to produce thermoplastic composites containing long or continuous fibers often result in incomplete resin impregnation and poor bonding between thermoplastic matrix and reinforcing fibers. Thus, there is a need to develop new ways to improve mechanical properties of the thermoplastic composite materials. These and other issues are addressed in the present application.

BRIEF SUMMARY

Methods of making and using fiber-resin compositions in the construction of fiber-reinforced thermoplastic composite articles are described. The present compositions include the combination of reactive thermoplastic resin compositions and continuous fibers, including rovings. The reactive resin composition may be melted in a melting device, such as an extruder, and subsequently combined with the fibers. The low-viscosity reactive thermoplastic resin compositions are significantly easier to wet and mix with the fibers compared to a high-viscosity melt of the polymerized thermoplastic resin. Fiber-resin compositions may also have long fibers, where the length of the fiber is equal or about equal to the length of a fiber-resin pellet. Composite articles produced by methods described herein have improved mechanical properties, including increased tensile strength, impact strength, and stiffness.

Embodiments of the present technology may include a method of making a thermoplastic composite. The method may include melting a reactive thermoplastic resin to form a molten reactive resin. The method may also include fully impregnating a plurality of continuous fibers, such as rovings, with the molten reactive resin in an impregnation device. The method may further include polymerizing the molten reactive resin to form a thermoplastic matrix. The resulting thermoplastic composite may include the plurality of fibers and a polymerized resin.

Embodiments may also include a method of making a composite article. The method may include melting a reactive thermoplastic resin. The method may also include fully impregnating a roving with the molten reactive resin in an impregnation device. The method may further include polymerizing the molten reactive resin to form a thermoplastic composite strand comprising the roving and a polymerized resin. The method may further include chopping the thermoplastic composite strand into pellets. Furthermore, the method may include mixing the thermoplastic composite pellets with a second thermoplastic resin to form a mixture. The method may also include forming the mixture of the thermoplastic composite pellets and the second thermoplastic resin into composite article.

Some embodiments may include a method of making a thermoplastic composite. The method may include melting in an extruder a reactive thermoplastic resin to form a molten reactive resin. The method may also include fully impregnating a roving with the molten reactive resin in an impregnation device. The method may further include polymerizing the molten reactive resin to form a thermoplastic composite strand comprising the roving and a thermoplastic resin. The thermoplastic composite strand may comprise rovings fully impregnated with a thermoplastic resin.

Embodiments may also include a thermoplastic composite formed by any of the methods described herein. The thermoplastic composite may include continuous strands, or the thermoplastic composite may include pellets.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION

Figure 1:
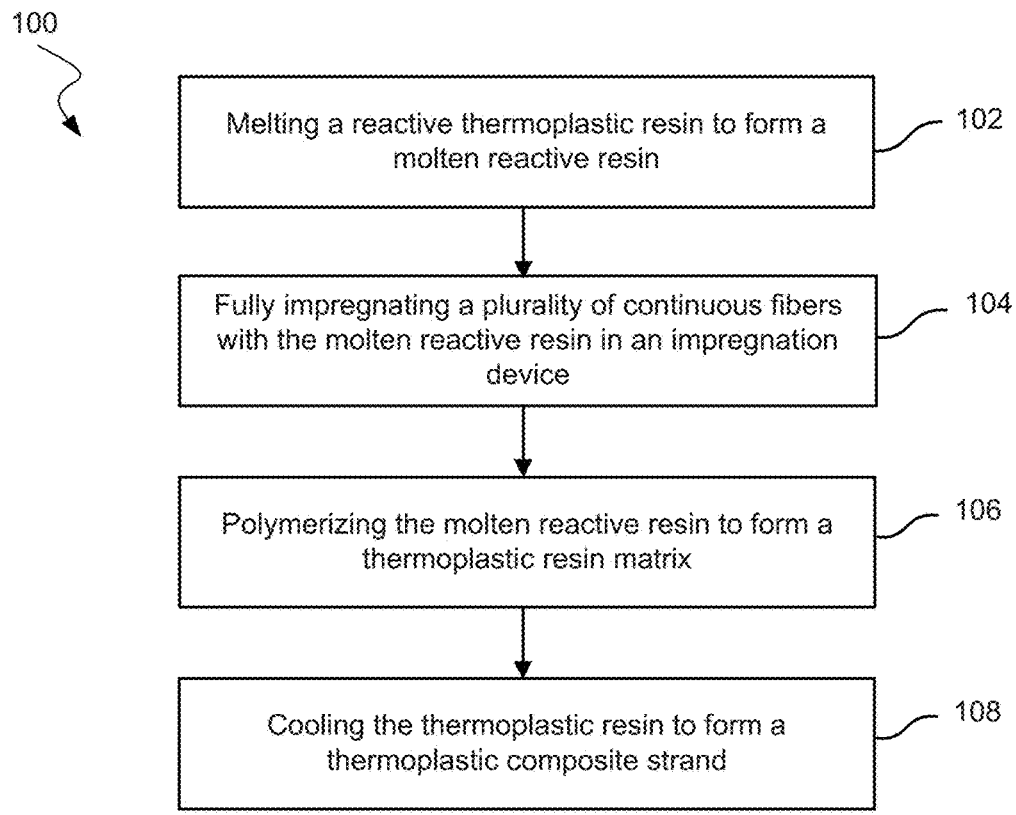
FIG. 1 shows a method of making a thermoplastic composite strand according to embodiments of the present technology.

Conventional methods of forming fiber-thermoplastic resin compositions include compounding and long fiber thermoplastic (LFT) processes. These conventional processes involve melts of thermoplastic polymers, which lead to less than ideal compositions. In conventional compounding process, fibers may be fed into an extruder, and as a result of this process, fibers may be reduced to a length of less than 1 mm. The small length of the fibers in a fiber-resin composition decreases the strength and other mechanical properties of the final composite article. Conventional LFT processes involve longer fibers but include high viscosity thermoplastic polymer melts. The high viscosity thermoplastic polymer melts may not wet fibers as effectively as low viscosity reactive resins, which may result in incomplete resin impregnation of fibers and/or voids in a fiber-resin composition. The high processing temperature needed to melt thermoplastic polymers may also lead to undesired degradation reactions. Roving coating processes, such as wire coating, may coat a continuous roving. However conventional roving coating processes again involve high viscosity thermoplastic resins, which often leads to surface coating of the roving and does not result in a fully impregnated roving. The fiber-resin composition and composite articles resulting from conventional processes may lack the superior mechanical properties of compositions and methods of the present application.

The present application includes methods of making exemplary fiber-resin compositions from reactive thermoplastic resin compositions that include low-viscosity melts of monomers and/or oligomers that can polymerize into a thermoplastic resin holding the fibers. The low-viscosity reactive thermoplastic resin compositions are significantly easier to wet fibers compared to a highly viscous melt of the thermoplastic polymer resin. Reactive thermoplastic resins may polymerize at a temperature lower than the melting point of the corresponding thermoplastic polymers, allowing for more process flexibility and reduced manufacturing cost. The fiber-resin compositions may be combined with a second thermoplastic resin and formed into a fiber-reinforced composite article using a variety of thermoplastic molding techniques, including injection molding, compression molding, and local reinforcement. In some instances, a second thermoplastic resin may be added to the fiber-resin composition and the resulting composition may be injection molded. Tensile strength, impact strength, or modulus (stiffness) may increase over conventional processes. Details about the methods and systems used to make the exemplary fiber-reinforced compositions and composite articles are described below.

Exemplary Fibers

The fibers may be one or more types of fibers chosen from glass fibers, ceramic fibers, carbon fibers, metal fibers, and organic polymer fibers, among other kinds of fibers. Exemplary glass fibers may include "E-glass", "A-glass", "C-glass", "S-glass", "ECR-glass" (corrosion resistant glass), "T-glass", and fluorine and/or boron-free derivatives thereof. Exemplary ceramic fibers may include aluminum oxide, silicon carbide, silicon nitride, silicon carbide, and basalt fibers, among others. Exemplary carbon fibers may include graphite, semi-crystalline carbon, and carbon nano tubes, among other types of carbon fibers. Exemplary metal fibers may include aluminum, steel, and tungsten, among other types of metal fibers. Exemplary organic polymer fibers may include aramid fibers, polyester fibers, and polyamide fibers, among other types of organic polymer fibers. Fibers may include natural fibers, which may include wood fibers, cellulose fibers, manmade fibers based on natural resources (e.g., lignin), or combinations thereof.

Exemplary Reactive Thermoplastic Resin Compositions

Reactive thermoplastic resin compositions may include monomers and/or oligomers capable of polymerizing into a thermoplastic resin matrix that binds the plurality of fibers. Exemplary reactive resin compositions may include caprolactam. Caprolactam is a cyclic amide of caproic acid with an empirical formula $(CH_2)_5C(O)NH$, which may be represented by the structural formula:

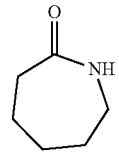

Caprolactam has a low melting point of approximately 68° C. and a melted viscosity (0.004-0.008 Pa·s) that is close to water, making it well suited for wetting and mixing with reinforcing fibers. Typically, the caprolactam-containing reactive resin composition may be introduced to the plurality of fibers as a liquid melt.

Caprolactam-containing reactive resin compositions may also include polymerization agents such as a polymerization catalyst or a polymerization activator. Exemplary polymerization catalysts may include a salt of a lactam, and the salt may be an alkali metal salt, an alkali-earth metal salt, and/or a Grignard salt of the caprolactam. For example the polymerization catalyst may be an alkali metal salt of caprolactam, such as sodium caprolactam. In another example, the polymerization catalyst may be a Grignard salt of the caprolactam, such as a magnesium bromide salt of the caprolactam. As used herein, a polymerization activator may be any material that activates the polymerization of monomers or oligomers. Exemplary activators for the anionic polymerization of caprolactam include caprolactam blocked isocyanates and N-acylcaprolactams. Polymerization agents may also be present on the fibers, and in some instances a polymerization agent may be present both in the reactive resin composition and on the fibers. Incorporating a polymerization agent on the reinforcing fibers can render the fibers reactive, and reduce or eliminate its presence in the reactive resin composition, which may increase the pot-life of the reactive resin composition prior to being applied to the fibers.

Exemplary reactive resin compositions may also include additional type of lactam compounds, such as laurolactam, a cyclic amide where the heterocyclic ring includes 12 carbon atoms $(C_{12}H_{23}NO)$.

Exemplary reactive resin compositions may also include oligomers of a cyclic alkylene terephthalate, such as cyclic butylene terephthalate (CBT). An exemplary CBT, whose ring includes two butylene groups and two terephthalate groups, is illustrated below:

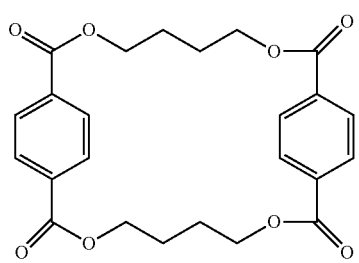 [SMILES: O=C1OCCCCOC(=O)c2ccc(cc2)C(=O)OCCCCOC(=O)c2ccc1cc2]

It should be appreciated that the present CBT may include additional butylene and/or terephthalate groups incorporated into the ring. It should also be appreciated that some exemplary CBT may have other moieties coupled to the CBT ring. CBT may include a plurality of dimers, trimers, tetramers, etc., of butylene terephthalate.

CBT resins are typically solids at room temperature (e.g., about 20° C.), and begin to melt at around 120° C. At around 160° C., CBTs are generally fully melted with a liquid viscosity of about 0.15 Pa·s. As the molten CBTs are heated further, the viscosity may continue to drop, and in some instances may reach about 0.03 Pa·s at about 190° C. The CBT oligomers may be selected to have a melting temperature range of, for example, 120-190° C.

CBT-containing reactive resin compositions may be introduced to the plurality of fibers as a melt. The reactive resin composition may include additional compounds such as polymerization catalysts, polymerization promoters, colorants, flame retardants, ultraviolet stabilizers, and fillers including inorganic particles and carbon nanotubes, among other additional compounds. When the resin is a CBT, the polymerization catalyst is selected to drive the polymerization of these types of macrocyclic oligoesters. Exemplary polymerization catalysts may include organometallic compounds such as organo-tin compounds and/or organo-titanate compounds. One specific polymerization catalyst for the CBT oligomers may be butyltin chloride dihydroxide.

The CBT-containing reactive resin composition may also include a polymerization promoter that accelerates the polymerization rate of the oligomers. When the resin is CBT, the polymerization promoter may by an alcohol and/or epoxide compound. Exemplary alcohols may include one or more hydroxyl groups, such as mono-alcohols (e.g., butanol), diols (e.g., ethylene glycol, 2-ethyl-1,3-hexanediol, bis(4-hydroxybutyl)terephthalate), triols, and other polyols. Exemplary epoxides may include one or more epoxide groups such as monoepoxide, diepoxide, and higher epoxides, such as bisphenol A diglycidylether. They may also include polyol and polyepoxides, such as poly(ethylene glycol).

Additional reactive resin compositions may include compositions of monomers and/or oligomers that polymerize into polymers such as polyamides, polyesters, thermoplastic polyurethane (TPU), polyacrylates including polymethyl methacrylate (PMMA) and poly(hydroxyl-ethyl methacrylate), or mixtures thereof. These reactive resin compositions may include a polymerization agent, such as a polymerization initiator or catalyst.

Thermoplastic resins may be formed from in situ polymerization of monomers and/or oligomers in reactive thermoplastic resin. Exemplary thermoplastic resins may include polyamides, polybutylene terephthalate (PBT), thermoplastic polyurethane (TPU), polymethyl methacrylate (PMMA), poly(hydroxyl-ethyl methacrylate), or mixtures thereof. Specific examples of polyamides may include polyamide-6, polyamide-12, among other polyamide polymers. The thermoplastic polymer may also include copolymers, such as the polyamide copolymer from the anionic co-polymerization of caprolactam and laurolactam.

Exemplary Reactive Thermoplastic Resin Combinations

The reactive thermoplastic resin compositions may include a single type of monomer and/or oligomer such as caprolactam or CBT, or alternatively may include two or more types of monomers and/or oligomers. For example, the reactive resin composition may include both caprolactam and laurolactam. The addition of laurolactam as co-monomer to caprolactam can improve the impact strength and increase water resistance of the resulting thermoplastic resin matrix. Additional reactive resin compositions may include combinations of first and second resin systems having different polymerization temperatures. This may allow the formation of a semi-reactive fiber-resin composition that contains a polymerized resin of the first resin system having a lower polymerization temperature, while also containing unpolymerized monomers/oligomers of the second resin system having a higher polymerization temperature. For example, a reactive resin combination of caprolactam and CBT may be selected such that the CBT has a higher polymerization temperature than the caprolactam. Alternatively, a reactive resin combination can be formulated of two different types of cyclic alkylene terephthalates and/or a bimodal molecular weight distribution of CBT oligomers having different polymerization temperatures.

Exemplary Methods and Products
Composite Strands

As shown in FIG. 1, embodiments of the present technology may include a method 100 of making a thermoplastic composite strand. Method 100 may include melting a reactive thermoplastic resin to form a molten reactive resin (block 102). An extruder may be used to melt the reactive thermoplastic resin. The reactive thermoplastic resin may initially include only monomers and no oligomers. The reactive thermoplastic resin may have a low viscosity. Exemplary reactive thermoplastic resins may have a viscosity lower than 0.1 Pa·s. Partially as a result of the low viscosity of the reactive thermoplastic resin, the reactive resin can more easily wet and coat the plurality of fibers than in conventional processes such as LFT, where highly viscous thermoplastic polymer melts are used. The low viscosity reactive resin also may reduce the formation of bubbles or voids in the resin.

The reactive thermoplastic resin may include a polymerization agent. The polymerization agent may be a polymerization initiator, a polymerization catalyst, a polymerization activator, or combinations thereof. The polymerization initiator may initiate polymerization of the monomers or oligomers. The polymerization catalyst may catalyze a polymerization reaction. A reactive thermoplastic resin may be a resin that contains components that can polymerize in situ under certain conditions.

The molten reactive resin may be fed into an impregnation device to impregnate a plurality of fibers. Because the viscosity of the reactive resin is very low (<0.1 Pa·s), the reactive resin may be injected into the impregnation device by typical liquid handling techniques.

Method 100 may also include fully impregnating a plurality of continuous fibers with the molten reactive resin in an impregnation device (block 104). The fibers may be any fiber described herein or combinations thereof. The plurality of continuous fibers may include a roving. With a roving, the molten reactive resin may fully impregnate the fibers in the roving. Fully impregnated may mean that the fibers are completely wetted or impregnated with the reactive resin composition. Substantially no voids in coverage of the surface of the fibers may be present. Higher fiber content may be achieved through the method of the present invention. For example, greater than 40%, greater than 60%, or greater than 80% by weight of fiber content, including up to about 90% by weight of fiber content, may be achieved.

The fibers may have been sized with a sizing composition. The sizing composition may be applied to fibers prior to the impregnation with the reactive resin. The sizing composition may include a silane coupling agent. Exemplary silane coupling agents may include gamma-aminopropyltriethoxysilane. The silane coupling agent may include a coupling activator compound of the formula, S-X-A. S may represent a silane coupling moiety capable of bonding to the fiber. A may represent an anionic ring-opening polymerization activator moiety or a blocked precursor thereof. X may represent an alkyl, aryl, or alkyl-aryl linking moiety. The silane coupling agent may include 2-oxo-N-(3-(triethoxysilyl)propyl)azepane-1-carboxamide. Silane coupling agents may be any coupling activator compound described in U.S. Patent Publication No. 2011/0045275 and U.S. Patent Publication No. 2015/0148498, which are incorporated herein by reference for all purposes.

The impregnation device may be an impregnation die, including a cross-head die. The impregnation die may be configured to contain the reactive resin. While high viscosity resins, including polymerized thermoplastic resins, may not easily flow through spaces in an impregnation die, a low viscosity reactive thermoplastic resin may. As a result, an impregnation die for reactive thermoplastic resin should be configured to minimize spaces within the die, so that the molten reactive resin injected to the die may be completely absorbed by the moving fibers. In this manner, solid polymers forming in the die may be avoided.

Method 100 may further include polymerizing the molten reactive resin to form a thermoplastic resin matrix (block 106). The resulting thermoplastic composite strand may include the plurality of fibers and a polymerized resin. Monomers and oligomers in the reactive thermoplastic resin may include precursors of polyamides, polybutylene terephthalate (PBT), thermoplastic polyurethane (TPU), polymethyl methacrylate (PMMA), poly(hydroxyl-ethyl methacrylate), or mixtures thereof. For example, the reactive resin may include lactams, macrocyclic polyesters, acrylates, or mixtures thereof. Polymerizing may include polymerizing monomers or oligomer precursors into polyamide, and polymerizing may include anionically polymerizing caprolactam into polyamide-6. Polymerizing the monomers or oligomers may include pulling the plurality of impregnated fibers or the roving coated with the molten reactive resin through a curing oven. The molten reactive resin may include or exclude either monomers or oligomers. In some embodiments, the exposure of the reactive resin to moisture may be minimized. Polymerizing may be done in the absence of moisture, which may be detrimental to polymerizations such as the anionic polymerization of caprolactam. Flowing nitrogen or an inert gas in the curing oven may help prevent the exposure to moisture during the polymerization process.

In addition, method 100 may include cooling the thermoplastic resin matrix to form the thermoplastic composite strand (block 108). The thermoplastic composite strand may contain greater than 40% by weight, 60% by weight, or 80% by weight, including up to about 90% by weight of fibers. The composite strand may be a plurality of continuous fibers coated with a solid thermoplastic resin. In some embodiments, the method may include winding the composite strand. For example, the composite thread may be wound around a spool or similar device.

Some embodiments may include a method of making a thermoplastic composite. The method may include melting in an extruder a reactive thermoplastic resin to form a molten reactive thermoplastic resin. The method may also include fully impregnating a roving with the molten reactive thermoplastic resin in an impregnation device. The roving may not pass through the extruder. The method may further include polymerizing the molten reactive resin to form a thermoplastic matrix. In addition, the method may include cooling the thermoplastic matrix to form a thermoplastic composite strand. The thermoplastic composite strand may comprise continuous fibers fully impregnated with a thermoplastic resin.

Embodiments may also include a thermoplastic composite formed by any of the methods described herein. The thermoplastic composite may include a continuous strand.

Thermoplastic Composite Concentrates

In some embodiments, the thermoplastic composite strand may be chopped into a plurality of pellets. In some embodiments, the plurality of pellets may include a pellet with a length of 1 mm or more, 3 mm or more, 6 mm or more, 12 mm or more, or 25 mm or more. The plurality of pellets may include fibers having the same length as the length of the pellet. The average length of the pellets may be the average length of the fibers. The average length may be any length described herein. The average may be the mean, median, or mode.

In some embodiments, 40% or more, 60% or more, or 80% or more by weight of the thermoplastic composite pellet may be glass fiber. In other embodiments, 70 wt. % or more may be glass fiber. The rest of the thermoplastic composite pellet may be resin. Conventional extrusion compounding processes may result in glass fiber weight percentages of around 30 wt. %. By contrast, these high fiber content thermoplastic composite pellets, which may be termed thermoplastic composite concentrates, may allow for blending with additional thermoplastic resins to achieve desired fiber content. In addition, these thermoplastic composite concentrates may be combined with additional thermoplastic resins for the manufacturing of composite articles, and the fiber content in a composite article may be tailored for a specific application. In some embodiments, thermoplastic composite concentrates may be in pellet form.

Composite Articles

Figure 2:
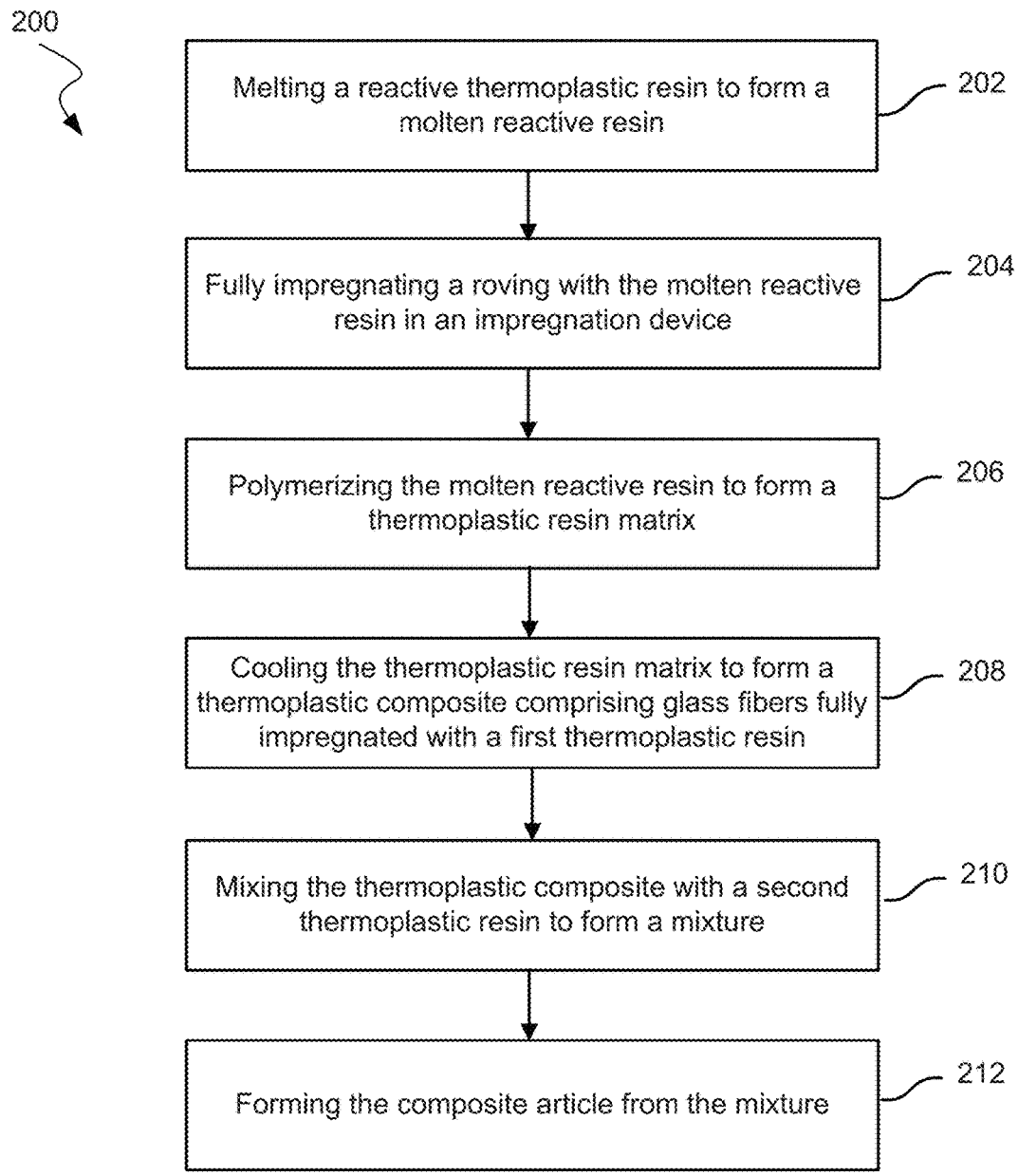
FIG. 2 shows a method of making a composite article according to embodiments of the present technology.

As seen in FIG. 2, embodiments may also include a method 200 of making a composite article. Method 200 may include melting a reactive thermoplastic resin to form a molten reactive resin (block 202). The reactive resin may be any resin described herein.

Method 200 may also include fully impregnating a roving with the molten reactive resin in an impregnation device (block 204). The roving may include any plurality of fibers described herein. The impregnation device may be any impregnation device described herein.

Method 200 may further include polymerizing the molten reactive resin to form a thermoplastic resin matrix (block 206).

Additionally, method 200 may include cooling the thermoplastic resin matrix to form a thermoplastic composite strand including fibers fully impregnated with a first thermoplastic resin (block 208). The thermoplastic composite strand may include composites with high weight percentages of glass fiber.

Method 200 may further include forming a plurality of pellets from the thermoplastic composite strand. Pellets may be any pellets described herein. In some embodiments, composites may include a continuous fiber and not be chopped into pellets.

Furthermore, method 200 may include mixing the thermoplastic composite with a second thermoplastic resin to form a mixture (block 210). The mixture of the thermoplastic composite pellets and the second thermoplastic resin may be used to produce thermoplastic composite article.

The second thermoplastic resin may be a polymerized thermoplastic resin. Exemplary polymerized thermoplastic resins may include polyamide-6 that is produced from the hydrolytic polymerization of caprolactam. Exemplary polymerized thermoplastic resins may also include polybutylene terephthalate (PBT) that is produced by the condensation polymerization of butanediol and terephthalic acid. The second thermoplastic resin may be in a solid form, including powder, pellets, or spheres.

Method 200 may also include forming the mixture of the thermoplastic composite pellets and the second thermoplastic resin into the composite article (block 212). The composite article may include greater than 10 wt. %, 20 wt. %, or 30 wt. % glass fiber. Forming the composite article may include transferring the mixture to a mold or molding the mixture. Method 200 may include processing the mixture through an injection molding process or a compression molding process. Embodiments may include a composite article formed by any method described herein.

Methods described herein may include pellets or other composites with full resin impregnation. What is more, methods may include incorporating high molecular weight thermoplastics in the composite article. Higher molecular weight thermoplastic polymers may be formed via the in-situ polymerization described herein, as compared to the thermoplastic polymers used in conventional polymer melt processing. Higher molecular weight thermoplastic polymer resins may not be possible or practical with conventional processes because such thermoplastic resins would have prohibitively high viscosities. As a result of these and other reasons, the composite article may have mechanical properties superior to a composite article produced by a conventional process, including extrusion compounding and LFT.

Oligomerizing the Reactive Thermoplastic Resin

In some embodiments, the reactive thermoplastic resin may be melted at a temperature equal to or greater than the polymerization temperature. For example, the extruder may be run at the polymerization temperature for a limited time. As a result, some, substantially all, or all of the monomers in the reactive resin may form oligomers. Methods, such as method 100 and method 200, may further include polymerizing the oligomers into polymers. Forming oligomers in the extruder and polymerizing the resulting oligomers instead of monomers may reduce polymerization time after the resin is contacted with fibers, may increase throughput, and may decrease capital costs for equipment.

Exemplary Composition and Article Fabrication Systems

Figure 3:
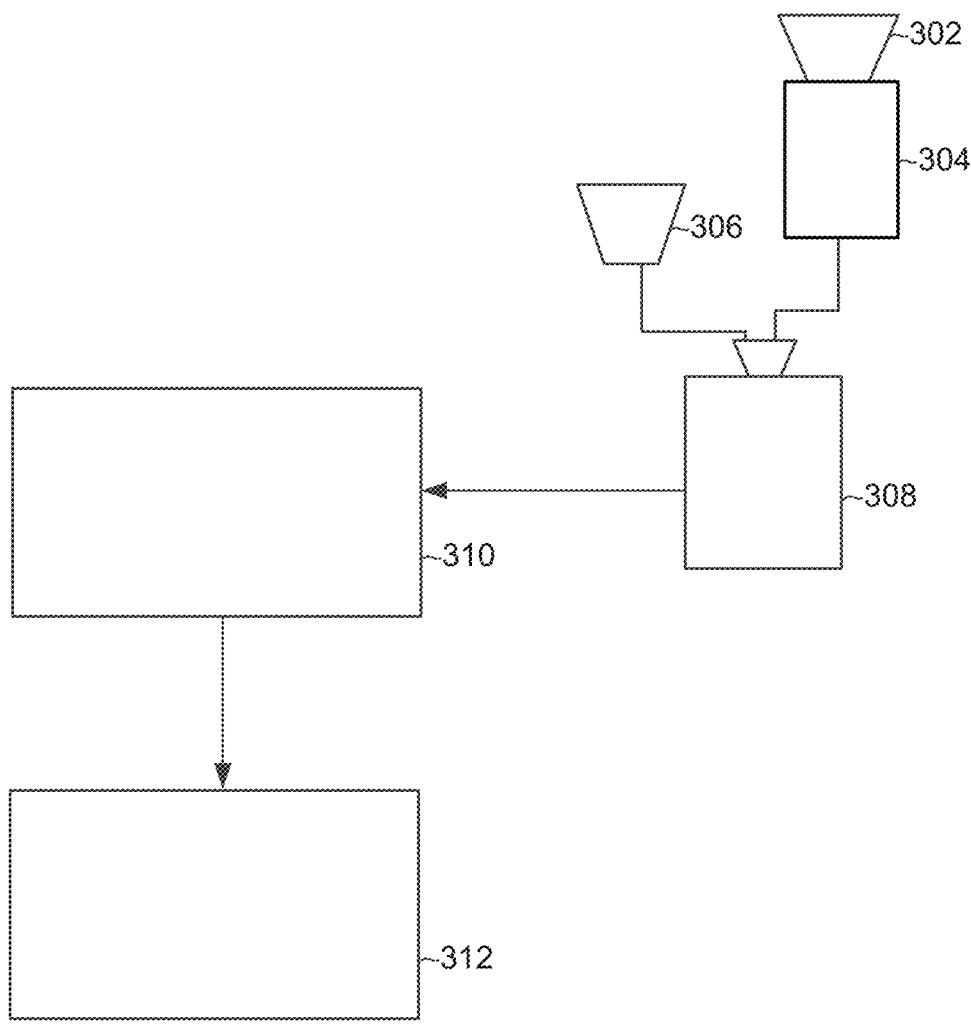
FIG. 3 shows an example system for making fiber-resin composites and fiber-reinforced articles according to embodiments of the present technology.

FIG. 3 shows an exemplary system 300 for making the present fiber-resin composites and fiber-reinforced articles. The system 300 includes a supply of a reactive thermoplastic resin composition 302 fed to an extruder 304. The melted reactive resin composition and a supply of continuous fibers 306 can be fed to an impregnation device 308. The reactive resin coated on the fibers is then polymerized in a polymerization device 310 to form a thermoplastic resin matrix.

The fully impregnated thermoplastic composite strands may be directly supplied to a molding machine 312 that forms the composition into the fiber-reinforced composite article. In some embodiments, the fully impregnated composite strands may be chopped to pellets. The composite pellets may be mixed with a second thermoplastic resin to produce composite articles in a molding process. Exemplary molding machines 312 may include injection molding machines, among other types of molding machines.

Exemplary Fiber-Reinforced Composite Articles

Figure 4:
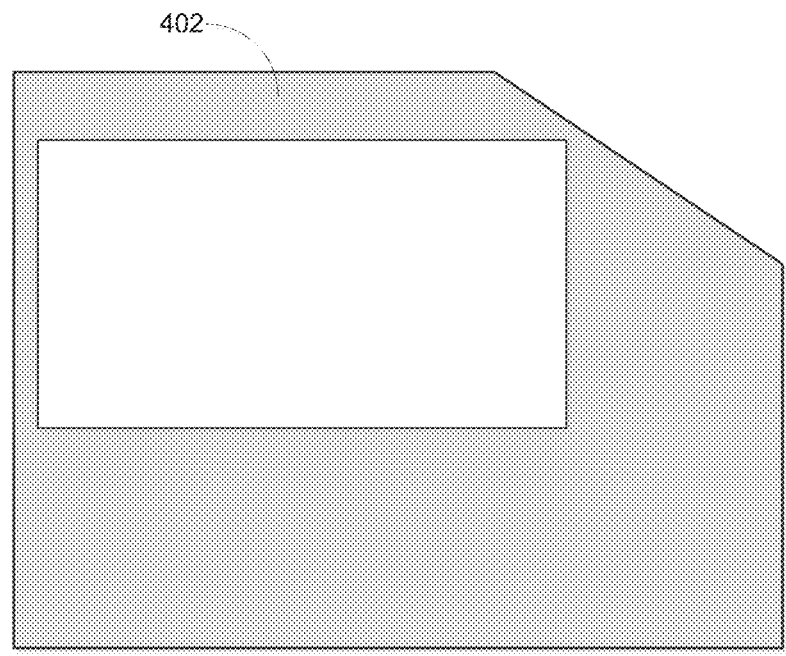
FIG. 4 shows an example fiber-reinforced article made according to the embodiments of the present technology.

FIG. 4 shows an exemplary fiber-reinforced composite vehicle part 402 formed by the fiber-resin compositions. Vehicle part 402 may be an exterior automobile panel. The vehicle part 402 is one of many types of articles that can be formed by the present methods and compositions. Other articles may include appliance parts, containers, etc. Smaller or intricate parts may use pellets in order to adequately form the part.

Exemplary Thermoplastic Composite Strand

A reactive thermoplastic resin containing caprolactam, sodium caprolactam, and caprolactam blocked isocyanates is melted in an extruder. The molten resin is then added to a roving of glass fibers in an impregnation device. The molten resin, being low viscosity, fully impregnates the roving. The resin, being a reactive resin, in situ and anionically polymerizes to form polyamide-6. The polyamide-6 solidifies after the completion of polymerization. The polyamide-6 and the roving together form a thermoplastic composite strand. The continuous glass fiber reinforced polyamide-6 composite strand is chopped into pellets. The polyamide-6 composite pellets are mixed with a hydrolytically polymerized polyamide-6 resin to form a mixture. The mixture is formed into a composite article through a molding process. Some of the mixture is formed into a composite article using an injection molding process.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Additionally, details of any specific embodiment may not always be present in variations of that embodiment or may be added to other embodiments.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither, or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a method" includes a plurality of such methods and reference to "the fiber" includes reference to one or more fibers and equivalents thereof known to those skilled in the art, and so forth. The invention has now been described in detail for the purposes of clarity and understanding. However, it will be appreciated that certain changes and modifications may be practice within the scope of the appended claims.

What is claimed is:

1. A method of making a thermoplastic composite strand, the method comprising:
    melting a reactive thermoplastic resin to form a molten reactive resin;
    combining a plurality of continuous fibers with the molten reactive resin in an impregnation device to fully impregnate the plurality of continuous fibers with the molten reactive resin;
    polymerizing the molten reactive resin to form a thermoplastic resin matrix in a polymerization device; and
    cooling the thermoplastic resin matrix to form the thermoplastic composite strand.

2. The method of claim 1, wherein melting the reactive thermoplastic resin is in an extruder.

3. The method of claim 1, wherein the plurality of continuous fibers is a roving.

4. The method of claim 3, wherein polymerizing the molten reactive resin comprises pulling the roving impregnated with the molten reactive resin through a curing oven.

5. The method of claim 3, wherein the roving is sized with a reactive sizing composition.

6. The method of claim 5, wherein the reactive sizing composition comprises a polymerization agent.

7. The method of claim 6, wherein the polymerization agent comprises a polymerization catalyst, a polymerization activator, or a polymerization initiator.

8. The method of claim 1, wherein 40 wt. % or more of the thermoplastic composite strand comprises glass fiber.

9. The method of claim 1, wherein:
    the reactive thermoplastic resin comprises monomers,
    melting the reactive thermoplastic resin comprises forming oligomers from the monomers in the reactive thermoplastic resin, and
    polymerizing the molten reactive resin comprises polymerizing oligomers into polymers.

10. The method of claim 1, wherein:
    the reactive thermoplastic resin comprises monomers or oligomers, and
    polymerizing the molten reactive resin comprises polymerizing the monomers or oligomers into polymers.

11. The method of claim 1, further comprising:
    chopping the thermoplastic composite strand into a plurality of pellets, wherein the plurality of pellets comprises a pellet having a length, and the pellet comprises a fiber having the length.

12. The method of claim 11, wherein the length is 3 mm or more.

13. The method of claim 1, wherein the impregnation device is a cross-head die.

14. The method of claim 1, wherein polymerizing the molten reactive resin comprises polymerizing monomer or oligomer precursors of polyamides, polybutylene terephthalate, thermoplastic polyurethane, polymethyl methacrylate, or mixtures thereof.

15. The method of claim 1, wherein polymerizing the molten reactive resin comprises polymerizing monomer or oligomer precursors into a polyamide.

16. The method of claim 1, wherein polymerizing the molten reactive resin comprises anionically polymerizing caprolactam into polyamide-6.

17. The method of claim 1, wherein the reactive thermoplastic resin comprises a polymerization agent.

18. The method of claim 1, wherein polymerizing the molten reactive resin comprises polymerizing in the absence of water.

19. The method of claim 18, wherein polymerizing the molten reactive resin comprises flowing dry nitrogen or an inert gas in a curing oven.

20. The method of claim 1, wherein the plurality of continuous fibers comprises E-glass, A-glass, C-glass, S-glass, ECR-glass, T-glass, fluorine-free derivatives thereof, boron-free derivatives thereof, or carbon fibers.

21. A method of making a composite article, the method comprising:
    melting a reactive thermoplastic resin to form a molten reactive resin;
    fully impregnating a roving with the molten reactive resin in an impregnation device;
    polymerizing the molten reactive resin to form a first thermoplastic resin matrix in a polymerization device;
    cooling the first thermoplastic resin matrix to form a thermoplastic composite comprising fibers fully impregnated with the first thermoplastic resin matrix;
    mixing the thermoplastic composite with a second thermoplastic resin to form a mixture; and
    forming the composite article from the mixture.

22. The method of claim 21, wherein the first thermoplastic resin matrix comprises a polyamide-6 produced by in situ anionic polymerization of caprolactam, and the second thermoplastic resin comprises a hydrolytically polymerized polyamide-6.

23. The method of claim 21, further comprising:
    forming a plurality of pellets from the thermoplastic composite, wherein:
    mixing the thermoplastic composite with the second thermoplastic resin comprises mixing the plurality of pellets with the second thermoplastic resin.

24. The method of claim 21, wherein 40 wt. % or more of the thermoplastic composite comprises the fibers.

25. The method of claim 24, further comprising:
    forming a plurality of pellets from the thermoplastic composite, wherein:
    mixing the thermoplastic composite with the second thermoplastic resin comprises mixing the plurality of pellets with the second thermoplastic resin, and
    the composite article comprises greater than 10 wt. % glass fiber.

26. The method of claim 24, further comprising processing the mixture through an injection molding, a compression molding process, or a local reinforcement process.

* * * * *